United States Patent [19]
Makino et al.

[11] Patent Number: 6,062,877
[45] Date of Patent: May 16, 2000

[54] CONNECTOR FOR A CIRCUIT BOARD

[75] Inventors: Hirotaka Makino; Hajime Okada, both of Yokkaichi; Kouichi Shirouzu, Aichi-ken, all of Japan

[73] Assignee: Sumitomo Wiring Systems, Ltd., Japan

[21] Appl. No.: 08/898,189

[22] Filed: Jul. 22, 1997

[30]     Foreign Application Priority Data

Jul. 22, 1996  [JP]  Japan ................................. 8-192188

[51] Int. Cl.⁷ ....................................................... H01R 9/09
[52] U.S. Cl. .............................................................. 439/79
[58] Field of Search ....................................... 439/79, 381

[56]     References Cited

U.S. PATENT DOCUMENTS

| 4,056,300 | 11/1977 | Schumacher . | |
|---|---|---|---|
| 4,722,691 | 2/1988 | Gladd et al. | 439/79 |
| 5,370,540 | 12/1994 | Kobayashi | 439/78 |
| 5,827,076 | 10/1998 | Chen | 439/79 |

FOREIGN PATENT DOCUMENTS 62-136784  of 1987  Japan .
4-119973   of 1992  Japan .

*Primary Examiner*—Gary F. Paumen
*Attorney, Agent, or Firm*—Anthony J. Casella; Gerald E. Hespos; Michael J. Porco

[57]     ABSTRACT

A connector is provided to prevent an increase of stresses in soldered portions between terminals and a circuit board during thermal expansion. Terminals 11 are mounted in a housing 10 and are positioned by an alignment plate 12 for mounting in holes H of a circuit board P. Movable holding portions 17, which are elastically deformable, are formed in a plate main body 13 of the alignment plate 12. The movable holding portions 17 are connected with the plate main body 13 via connection portions 18. Positioning holes 15 for aligning the terminals 11 are formed in each movable holding portion 17. Even if the plate main body 13 is displaced with respect to the circuit board P due to thermal expansion with the terminals 11 fitted in and soldered to connection holes of the circuit board P, such a relative displacement is corrected by the elastic deformation of the movable holding portions 17 and the connection portions 18 and, accordingly, the positioning holes 15 are held in specified positions with respect to the connection holes. Therefore, there is no likelihood that stresses in the soldered portions increase due to the displacement of the positioning holes 15 with respect to the connection holes.

14 Claims, 4 Drawing Sheets

CONNECTOR FOR A CIRCUIT BOARD

BACKGROUND OF THE INVENTION

1. Field of the Invention

The present invention relates to a connector to be mounted on a circuit board.

2. Description of the Prior Art

A prior art connector for a circuit board is shown in FIG. 4, and is identified generally by the numeral 1. The prior art connector 1 includes narrow terminals 3 that are bent downwardly after projecting from a rear surface of a connector housing 2. The narrow terminals 3 have their respective leading ends arranged so as to conform to corresponding connection holes H of a circuit board P. When the prior art connector 1 is mounted on the circuit board P, the connector housing 2 is fixed to a specified position of the circuit board P. More particularly, the leading ends of the respective terminals 3 are fitted into the connection holes H and are secured by solder M.

An alignment plate 4 is secured to the connector housing 2 for securely fitting the leading ends of the terminals 3 into the connection holes H. The alignment plate 4 is formed with positioning holes 5 which are in alignment with the connection holes H of the circuit board P. The leading ends of the terminals 3 are passed through the respective positioning holes 5, and thereby are aligned with the corresponding connection holes H.

The connector housing 2, the alignment plate 4 and the circuit board P may undergo a thermal expansion after the connector 1 has been mounted on the circuit board P. This thermal expansion may cause the positioning holes 5 and the connection holes H to be displaced with respect to each other in a direction normal to the extension of the terminals 3 due to a difference in the coefficient of thermal expansion of the individual materials. However, accurate positioning of the terminals 3 requires the positioning holes 5 of the prior art alignment plate 4 to have a smallest size possible. Thus the terminals 3 are fitted into the positioning holes 5 so as not to move therein in directions normal to the extension of the pins. Accordingly, if a force acts to displace the positioning holes 5 of the alignment plate 4 with respect to the connection holes H of the circuit board P, this force is transmitted to the soldered portions M via the terminals 3, thereby increasing stresses in the soldered portions M.

The present invention was developed in view of the above problem, and its object is to improve the alignment of the plurality of terminals, in particular to prevent a stress in a soldered portion between a terminal and a circuit board from increasing.

SUMMARY OF THE INVENTION

According to the invention, there is provided a connector for a circuit board, comprising a connector housing to be mounted on a circuit board and/or to be connected to another connector housing. A plurality of terminals project from the connector housing. An alignment plate is formed with at least one movable holding portion. A plurality of positioning holes are formed through the movable holding portion. The positioning holes are dimensioned respectively to receive the terminals, and are disposed to register with connection holes in a circuit board. The movable holding portion is allowed to undergo an elastic deformation in a direction of or in a plane parallel with the alignment plate upon being subjected to a force, in particular from the terminals, which is larger than a predetermined force.

Accordingly, since the positioning holes are aligned in the same manner as the connection holes when the terminals are inserted through the positioning holes, the terminals can be smoothly fitted into the connection holes. Even if, after the fitting of the terminals, the connector housing and the plate main body are displaced with respect to the circuit board in the direction of the plane parallel with the alignment plate, the positioning holes can be held in the specified positions with respect to the connection holes of the circuit board since the movable holding portion undergoes an elastic deformation by being subjected to a pressing force from the terminals which acts according to this relative displacement. Therefore, an increase of stresses in the soldered portions between the terminals and the circuit board due to the displacement of the positioning holes with respect to the connection holes can be prevented.

According to a preferred embodiment of the invention, there is provided a connector for a circuit board, comprising a connector housing to be mounted on a circuit board. A plurality of terminals project from the connector housing and have their projecting ends fitted and soldered into connection holes formed in the circuit board. An alignment plate is formed with a plurality of positioning holes through which the respective terminals are inserted. The alignment plate is mounted on the connector housing with the respective terminals inserted through the positioning holes so as to conform the alignment of the terminals to that of the connection holes. The alignment plate comprises a plate main body to be fixed to the connector housing and at least one movable holding portion formed with the plurality of positioning holes. The movable holding portion is allowed to undergo an elastic deformation in a direction of a plane parallel with the alignment plate upon being subjected to a force which is larger than a predetermined force from the terminals.

Preferably, the movable holding portion has a narrow configuration and has its opposite ends connected with the plate main body by means of at least one connection portion and/or one part of the plurality of positioning holes are substantially aligned in a line along the length of the movable holding portion. Accordingly, since the movable holding portion has a narrow configuration and has its opposite ends connected with the plate main body and the positioning holes are aligned in a line, the movable holding portion is likely to undergo an elastic deformation, which prevents an increase of stresses in the soldered portions.

Preferably, the connection portion is allowed to undergo an elastic deformation in a direction of or in a plane parallel with the alignment plate.

Further preferably, the alignment plate is mounted or mountable on the connector housing with the respective terminals inserted through the positioning holes, so as to conform the alignment of the terminals to that of connection holes of the circuit board. According to a further preferred embodiment of the invention, the plurality of terminals have their projecting ends fitted or fittable into connection holes formed in the circuit board and preferably soldered therein.

Preferably, the plate main body is to be fixed to the connector housing.

Further preferably, the width of the movable holding portion is narrowed between adjacent positioning holes, preferably by notches. Accordingly, since the movable holding portion is narrowed between adjacent positioning holes, the movable holding portion is more likely to undergo an elastic deformation, which further prevents an increase of stresses in the soldered portions.

Preferably, the movable holding portions are defined by recessed or punched portions.

These and other objects, features and advantages of the present invention will become more apparent upon a reading of the following detailed description and accompanying drawings.

DETAILED DESCRIPTION OF THE PREFERRED EMBODIMENTS

Figure 1:
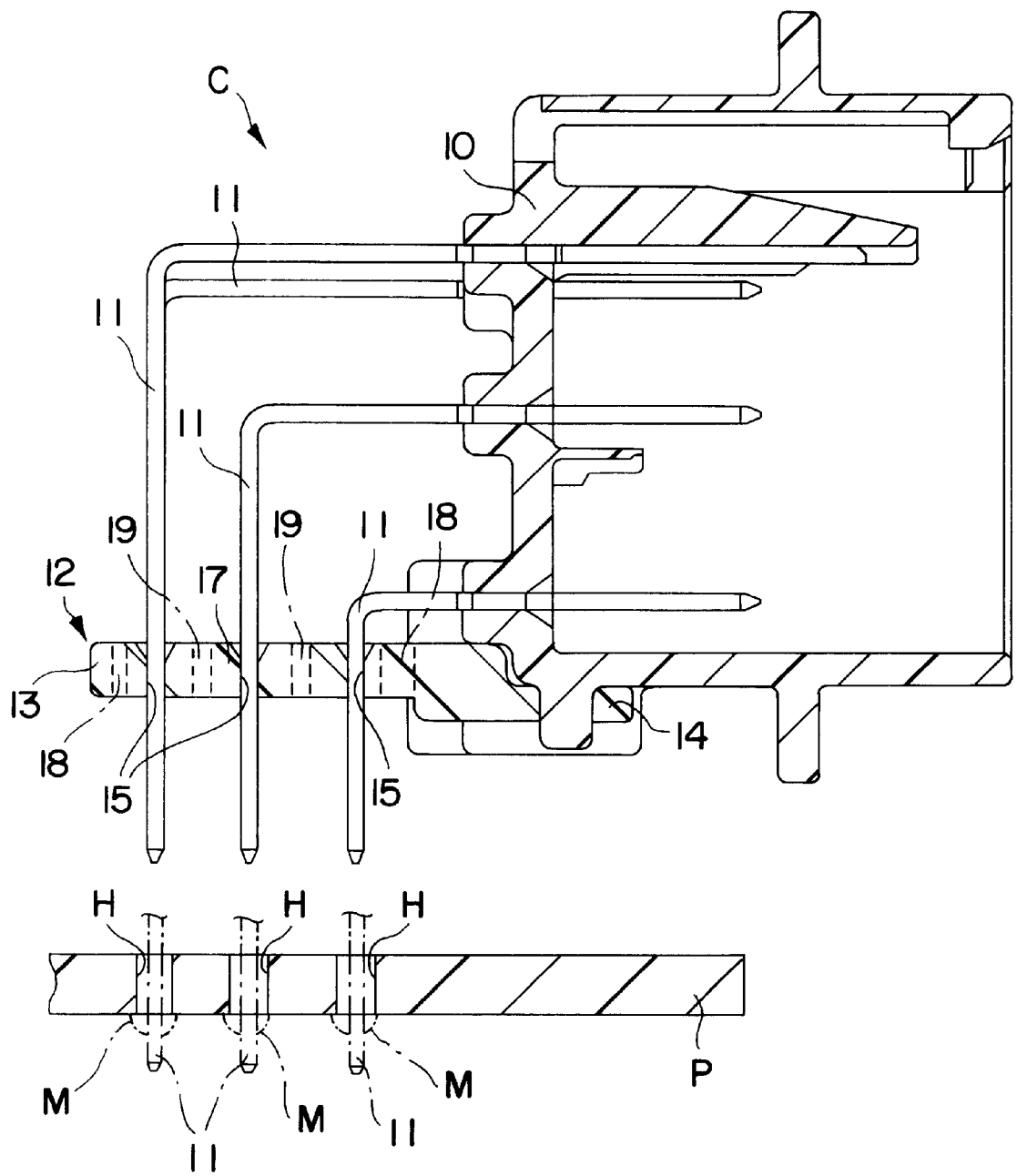
FIG. 1 is a section of a first embodiment of the invention.
Figure 2:
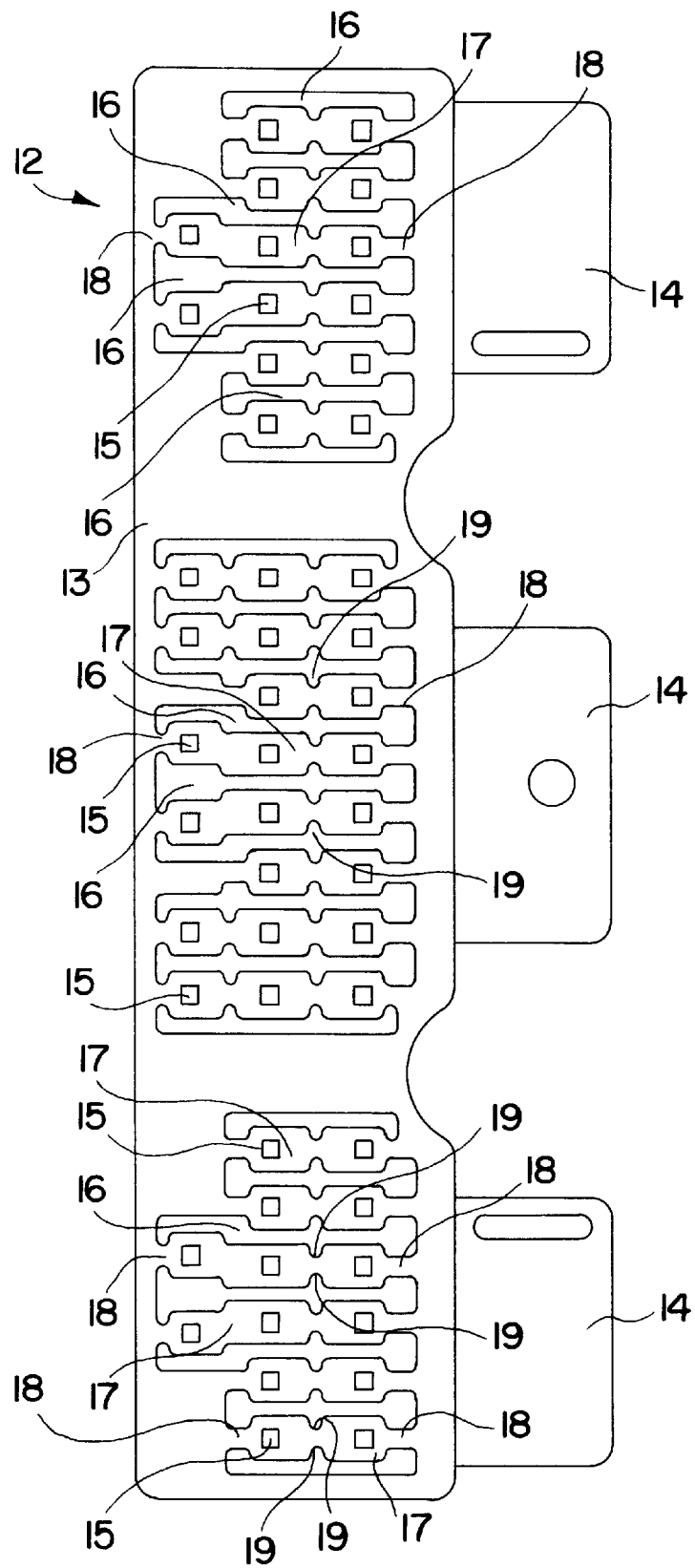
FIG. 2 is a bottom view of an alignment plate according to the first embodiment.

A connector C for a circuit board according to a first embodiment is shown in FIGS. 1 and 2 and comprises a connector housing 10, a plurality of terminals 11 and an alignment plate 12.

The connector housing 10 of the connector C is positioned in a predetermined or predeterminable position of a circuit board P with its bottom surface held in contact with the surface of the circuit board P. The connector housing 10 is secured to the circuit board P by a securing means (not shown), such as a screw. Alternatively the connector housing 10 may be coupled with another connector (not shown).

The plurality of terminals 11 are mounted or arranged in the connector housing 10. The respective terminals 11 are bent downwardly after projecting from the rear surface of the connector housing 10, and the leading ends thereof extend downwardly below the bottom surface of the connector housing 10 in a direction substantially normal to the bottom surface of the connector housing 10. The leading ends of the terminals 11 are to be inserted or fitted substantially simultaneously into the connection holes H of the circuit board P. Accordingly, the leading ends of the terminals 11 are aligned in parallel to each other and in conformity with the connection holes H of the circuit board P.

The alignment plate 12 includes an elongate plate main body 13 and one or more, e.g. three, mount portions 14 bulging from a longitudinal edge of the plate main body 13. The alignment plate 12 is fixed to the connector housing 10, e.g. by fixing the mount portions 14 to the bottom surface of the connector housing 10.

The plate main body 13 is formed with a plurality of positioning holes 15 which are arranged or substantially aligned in the same manner as the connection holes H of the circuit board P or the female connector portions of another connector (not shown). The positioning holes 15 preferably are through holes extending from the upper surface of the alignment plate 12 to the lower surface thereof. The terminals 11 are fittably inserted through the respective positioning holes 15. The terminals 11 inserted though the positioning holes 15 are highly accurately aligned such that the alignment thereof conforms to the alignment of the connection holes H. The alignment plate 12 is mounted on the connector housing 10 while aligning the terminals 11.

The plate main body 13 of the alignment plate 12 is formed with a plurality of substantially narrow punched portions 16 which extend in a direction (transverse direction of FIG. 2) substantially normal to the length of the plate main body 13. The punched portions 16 preferably are formed on opposite sides of two or three positioning holes 15 that are aligned substantially in a line along the transverse direction of the plastic main body 13. Narrow portions between adjacent punched portions 16 define movable holding portions 17. The respective movable holding portions 17 are connected with the plate main body 13 via connection portions 18. Notches 19 are formed in the side edges of each movable holding portion 17 at locations substantially between the positioning holes 15. The width of the movable holding portion 17 is locally narrowed in portions thereof where the notches 19 are formed. The width of the connection portions 18 is smaller than that of the movable holding portions 17.

The movable holding portions 17 and the connection portions 18 have such a rigidity as to hold the terminals 11 substantially aligned when the displaced terminals 11 are inserted into the positioning holes 15. However, the movable holding portions 17 undergo an elastic deformation upon being subjected to a force larger than a predetermined force along the length of the plate main body 13, which is in a vertical direction of FIG. 2 and substantially normal to the extension of the terminals 11. When the movable holding portions 17 and the connection portions 18 undergo an elastic deformation, the positioning holes 15 are displaced with respect to the plate main body 13. A force necessary to cause the elastic deformation of the movable holding portions 17 and the connection portions 18 is set smaller than a force that would generate a crack in soldered portions M between the terminals 11 and the circuit board P.

Before the connector C is mounted on the circuit board P, the terminals 11 are aligned and the alignment plate 12 is mounted on the connector housing 10. This operation is made by bringing the alignment plate 12 to the terminals 11 from below and inserting the terminals 11 into the corresponding positioning holes 15. At this time, if there is any displaced terminal 11, it is inserted into the corresponding positioning hole 15 after having its position corrected. Thus, all terminals 11 are highly accurately aligned so as to have the same alignment of the connection holes H. Thereafter, the alignment plate 12 is mounted on the connector housing 10.

In the case that there is any displaced terminal 11, the elastic restoring force of this terminal 11 acts on the movable holding portions 17 and the connection portions 18. However, since the movable holding portions 17 and the connection portions 18 have a rigidity sufficient to correct the position of the terminal 11, the elastic restoring force of the terminal 11 does not cause the elastic deformation of the movable holding portions 17 and the connection portions 18. Therefore, the terminals 11 can be positioned accurately.

After the terminals 11 are aligned and the alignment plate 12 is mounted on the connector housing 10, the connector C is mounted on the circuit board P. First, the leading ends of the terminals 11 aligned by the alignment plate 12 are fitted into the connection holes H of the circuit board P. At this time, since all terminals 11 are aligned so as to conform to the alignment of the connection holes H, they are smoothly fitted into the connection holes H at one time.

Then, the alignment plate 12 is brought closer to the circuit board P while the terminals 11 are fitted deeper into the connection holes H. The connector housing 10 is positioned and fixed in a specified position of the circuit board P, and the portions of the terminals 11 fitted into the connection holes H are secured by solder M. In this way, the mounting of the connector C on the circuit board P is completed.

When the circuit board P, the connector housing 10 and the alignment plate 12 undergo a thermal expansion after the connector C is mounted on the circuit board P, the plate main body 13 may be displaced with respect to the circuit board P along the length thereof if the degree and direction of the thermal expansion of these differ. In such a case, the movable holding portions 17 and the connection portions 18 are caused to undergo an elastic deformation in a direction of a plane parallel with the alignment plate 12 by a pressing force which relatively acts from the terminals 11. Accordingly, the displacement of the plate main body 13 with respect to the circuit board P is corrected by this elastic deformation and the positioning holes 15 are held in specified positions with respect to the connection holes H. At this time, the elastic restoring force of the movable holding portions 17 and the connection portions 18 acts on the terminals 11. However, since the force which causes the movable holding portions 17 and the connection portions 18 to undergo an elastic deformation is set smaller than a force which causes a crack in the soldered portions M as described above, there is no likelihood that the soldered portions M are cracked due to the elastic restoring force of the movable holding portions 17 and the connection portions 18.

Particularly in this embodiment, since the movable holding portions 17 have a narrow configuration and are connected with the plate main body 13 via the connection portions 18, the movable holding portions 17 are likely to undergo an elastic deformation. The width of the movable holding portions 17 is locally narrowed by the notches 19 between the positioning holes 15 and the width of the connection portions 18 is narrower than that of the movable holding portions 17. Because of this, the movable holding portions 17 are more likely to undergo an elastic deformation. With such configuration of the movable holding portions 17 and the connection portions 18, loads which act on the soldered portions M can be more reduced.

A second embodiment of the invention is described with reference to FIG. 3. In this embodiment, the configuration of movable holding portions is different from that of the movable holding portions 17 of the first embodiment. Since other elements are similar or same as those of the first embodiment, no description is given on the construction, action and effects thereof by identifying them by the same reference numerals.

Although the movable holding portions 17 of the first embodiment extend substantially along a direction which is normal to the length of the plate main body 13, narrow movable holding portions 27 extend substantially along the length of the plate main body 13 (vertical direction of FIG. 3) according to the second embodiment. Each movable holding portion 17 is formed with a plurality of positioning holes 15 aligned in a line, and has its ends connected with the plate main body 13 via connection portions 28. It should be noted that the movable holding portions 27 formed in the middle of the plate main body 13 along the vertical direction of FIG. 3 also have their side edges connected with the plate main body 13 via the connection portions 28 because of their long length. Each movable holding portion 17 is locally narrowed by notches 29 in positions between adjacent positioning holes 15. The width of the connection portions 28 is narrower than that of the movable holding portions 27.

Figure 3:
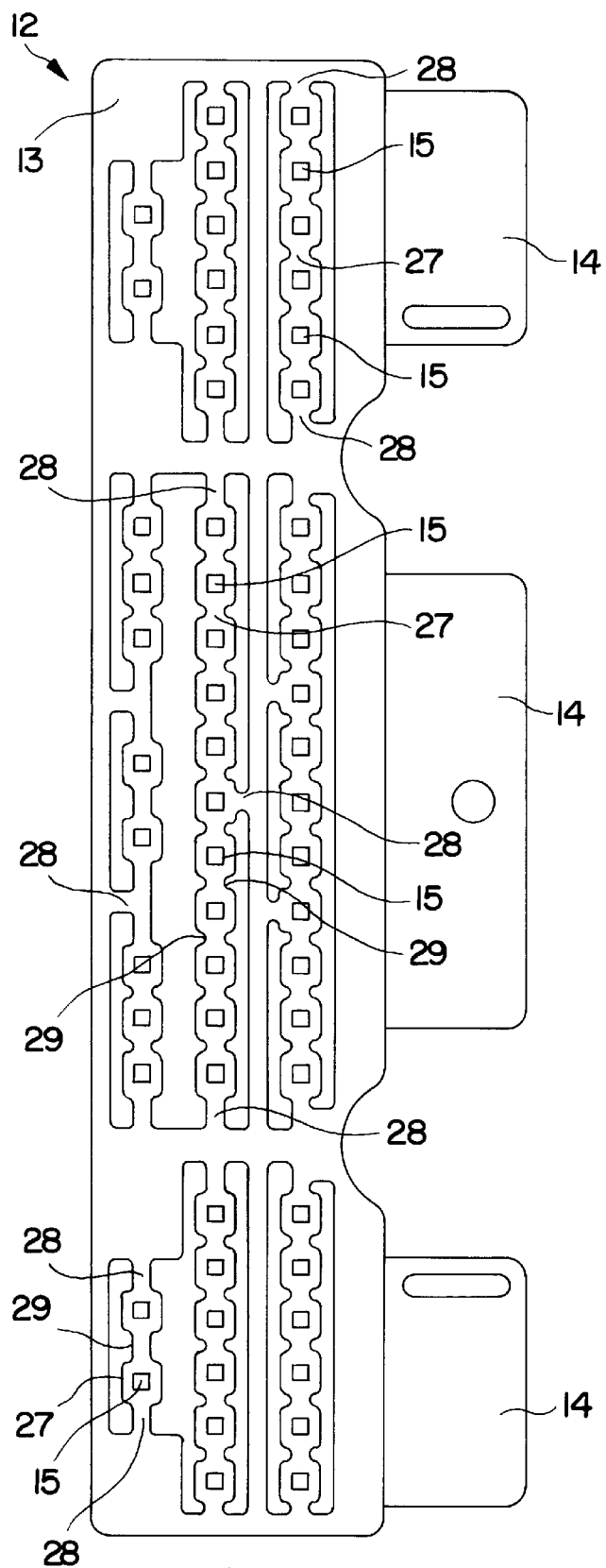
FIG. 3 is a bottom view of an alignment plate according to a second embodiment.
Figure 4:
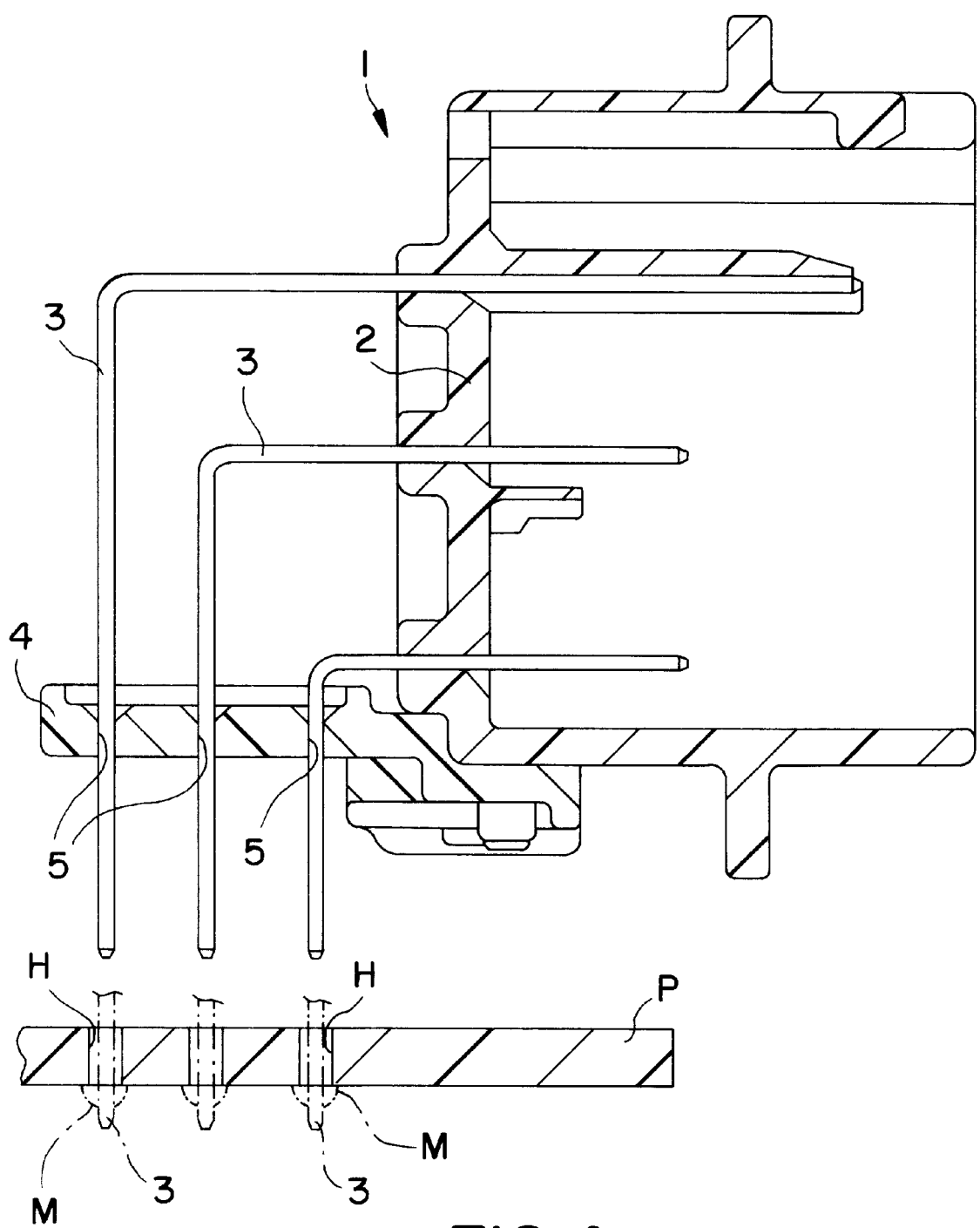
FIG. 4 is a section of a prior art connector.

The movable holding portions 27 and the connection portions 28 have such a rigidity as to hold the terminals 11 (not shown in FIG. 3) aligned when the displaced terminals 11 are inserted into the positioning holes 15, but to undergo an elastic deformation upon receipt of a force larger than a predetermined force along a direction substantially normal to the length of the plate main body (in a transverse direction of FIG. 3 which is normal to the extension of the terminals 11). When the movable holding portions 27 and the connection portions 28 undergo an elastic deformation, the positioning holes 15 are displaced with respect to the plate main body 13. A force necessary to cause the elastic deformation of the movable holding portions 27 and the connection portions 28 is set smaller than a force to generate a crack in soldered portions M where the terminals 11 are soldered to the circuit board P (not shown in FIG. 3).

With this embodiment as well, the terminals 11 can be so aligned as to be smoothly fitted into the connection holes H. Further, the displacement of the plate main body 13 with respect to the circuit board P during thermal expansion can be corrected by the elastic deformation of the movable holding portions 27 and the connection portions 28. Accordingly, this can prevent an increase of stresses in the soldered portions M.

The invention is not limited to the foregoing embodiments, but may, for example, be embodied as follows. These embodiments are also embraced by the technical scope of the invention as defined in the claims.

The number, configuration and arrangement of the movable holding portions, the number, configuration and arrangement of the positioning holes in each movable holding portion and the number, configuration and arrangement of the connection portions may be other than those described in the foregoing embodiments.

Although both the movable holding portions and the connection portions are caused to undergo an elastic deformation upon being subjected to a pressing force which is larger than a predetermined force, the connection portions may be barely deformable while the movable holding portions may be deformable.

Even though the above description has been made with respect to a connector housing to be mounted on a circuit board, the present invention may be applied to a connector to be connected to another connector (or to two connector housings to be connected with each other) having female terminals corresponding to the plurality of male terminals being elastically positioned by the alignment plate.

What is claimed is:

1. A connector for a circuit board, comprising:
   a connector housing to be mounted on a circuit board,
   a plurality of terminals projecting from the connector housing, and
   an alignment plate comprising a plate main body and a plurality of elongate movable holding portions, the movable holding portions being spaced from one another along at least a major portion of their respective lengths and each said movable holding portion being formed with a plurality of positioning holes defining a single substantially linear array in each said movable holding portion, each said terminal passing through a corresponding one of said positioning holes, the movable holding portions being elastically deformable in a direction parallel with the alignment plate upon being subjected to a force from the terminals which is larger than a predetermined force.

2. A connector according to claim 1, wherein each of the movable holding portions has a longitudinal direction and opposite ends, each of said opposite ends being connected with the plate main body by means of a connection portion, each of the substantially linear arrays of the positioning holes being substantially aligned along the longitudinal direction of the movable holding portion.

3. A connector according to claim 2, wherein the alignment plate is elongated and defines a direction of elongation, the connection portion being elastically deformable in the direction of elongation of the alignment plate.

4. A connector according to claim 3, wherein the connection portions are cross-sectionally smaller than portions adjacent said positioning holes.

5. A connector according to claim 2, wherein the movable holding portion is narrowed between adjacent positioning holes by notches.

6. A connector according to claim 2, wherein the movable holding portions are defined by punched portions.

7. A connector according to claim 1, wherein the alignment plate is mounted on the connector housing with the respective terminals inserted through the positioning holes to conform alignment of the terminals to an alignment of connection holes of the circuit board.

8. A connector according to claim 1, wherein the plurality of terminals have projecting ends fitted into connection holes formed in the circuit board and secured therein by solder.

9. A connector according to claim 1, wherein the plate main body is fixed to the connector housing.

10. A connector according to claim 1, wherein the plate main body includes opposed substantially parallel planer surfaces, a peripheral edge extending around said plate main body and between the opposed planer surfaces thereof, said plate main body having a peripheral region spaced inwardly on said alignment plate from said peripheral edge and extending substantially continuously about said plate main body, each said movable holding portion extending between spaced apart locations on said peripheral region of said plate main body.

11. A connector according to claim 1, wherein said plate main body is a substantially elongate rectangle having a direction of elongation, said movable holding portions being aligned substantially orthogonal to said direction of elongation.

12. A connector according to claim 1, wherein said plate main body is a substantially elongate rectangle having a direction of elongation, said movable holding portions being aligned substantially parallel to said direction of elongation.

13. A connector according to claim 1, wherein each said movable holding portion includes a pair of opposed side edges defining a width for each said movable holding portion, the widths of the respective movable holding portions at locations between the positioning holes being less than the widths of each said movable holding portion at locations substantially aligned with the positioning holes.

14. A connector according to claim 13, wherein the side edges of each said movable holding portion are provided with notches between their respective positioning holes.

* * * * *